(12) United States Patent
Fyson et al.

(10) Patent No.: US 7,642,039 B2
(45) Date of Patent: Jan. 5, 2010

(54) METHOD OF MAKING AN ADDRESS PLATE

(75) Inventors: John R. Fyson, Hackney (GB); Christopher B. Rider, New Malden (GB)

(73) Assignee: Eastman Kodak Company, Rochester, NY (US)

( * ) Notice: Subject to any disclaimer, the term of this patent is extended or adjusted under 35 U.S.C. 154(b) by 198 days.

(21) Appl. No.: 11/365,049

(22) Filed: Mar. 1, 2006

(65) Prior Publication Data

US 2006/0199110 A1 Sep. 7, 2006

(30) Foreign Application Priority Data

Mar. 2, 2005 (GB) .................. 0504265.0

(51) Int. Cl.
*G03F 7/26* (2006.01)
(52) U.S. Cl. .............. 430/312; 430/320; 430/314; 430/318
(58) Field of Classification Search ........... 430/320, 430/312, 317, 318, 311
See application file for complete search history.

(56) References Cited

U.S. PATENT DOCUMENTS 4,113,360 A 9/1978 Baur et al.

| | | | |
|---|---|---|---|
| 6,525,483 B1 | 2/2003 | Van Gorkom et al. | |
| 6,621,541 B1 | 9/2003 | Choi | |
| 2004/0140486 A1* | 7/2004 | Lee et al. | 257/208 |
| 2005/0012577 A1* | 1/2005 | Pillans et al. | 335/78 |
| 2005/0195470 A1* | 9/2005 | Takeda | 359/296 |

FOREIGN PATENT DOCUMENTS

WO    WO 2004/027489    9/2003

* cited by examiner

*Primary Examiner*—Brittany Raymond
(74) *Attorney, Agent, or Firm*—Nelson Adrian Blish

(57) ABSTRACT

A method of producing an address plate comprising the steps of; coating a layer of conducting inorganic material onto a substrate, coating a layer of photoresist above this layer of conductive material and curing this layer, exposing, through a mask, the desired pattern of the conductors onto the layer of photoresist, developing the photoresist and etching the layer of the conductive material and coating the resulting etched layer with a layer of dielectric material. A further layer of photoresist is then applied, the thickness of this layer being equal to the desired height of a relief pattern, curing the further layer of photoresist, exposing, through a second mask, the desired structure of the relief pattern onto the layer of photoresist, developing the photoresist and allowing the layer to dry. This results in spacers raised above the layer of dielectric material.

6 Claims, 2 Drawing Sheets

ITO ETCH LINES REGISTERED WITH CELL
GAPS IN NEXT STAGE

ITO ETCH LINES FROM PREVIOUS STAGE
REGISTERED WITH THESE LINES

METHOD OF MAKING AN ADDRESS PLATE

CROSS-REFERENCE TO RELATED APPLICATIONS

This application is based on GB Application Serial No. 0504265.0 filed Mar. 2, 2005.

FIELD OF THE INVENTION

This invention relates to display devices, in particular to a method of manufacturing a display device controlled by the application of a voltage across electrodes.

BACKGROUND OF THE INVENTION

Display devices including light guides are known in the prior art. For example, U.S. Pat. No. 4,113,360 discloses an indicating device for displaying symbols. The device is characterised by a plate of fluorescent material having metallized edges to create a light trap for the light created in the plate, a layer of light dispersing material mounted in spaced relation to a surface of the plate, contact film disposed at least in selected areas between the layer and plate and means for selectively moving portions of the layer into optical contact with the contact film and plate which causes emergence of the fluorescent light from the plate.

U.S. Pat. No. 6,525,483 discloses an improved device in which a complete display of pixels can be formed that can be addressed using column and row addressing. The display device has row and column electrodes, a movable element and means for supplying voltages to the electrodes. This structure is shown on a rigid glass support.

Manufacturing glass column plates is a difficult task and must be done batch wise. The relief structures on the column plate can be made by laser etching a suitable substrate, but this is a relatively high-energy slow process. The laser ablation also creates dust which must be removed before the device can be constructed.

PROBLEM TO BE SOLVED BY THE INVENTION

The invention aims to provide an alternative method of making a column plate, or address plate, such as for a device similar to that disclosed in U.S. Pat. No. 6,525,483. It will be understood by those skilled in the art that the method will be suitable for other devices as well. These might include electrowetting devices (e.g. similar to the device disclosed in WO 2004/027489) or electrophoretic displays (e.g. as shown in U.S. Pat. No. 6,621,541) where there is backlit fluid in which suspended objects move with time.

Preferably the method will allow the plate to be produced without the formation of laser dust.

SUMMARY OF THE INVENTION

According to the present invention, there is provided a method of producing an address plate comprising the steps of, coating a layer of conductive material onto a substrate, coating a layer of photoresist above this layer of conductive material, curing the layer of photoresist, exposing, through a mask, the desired pattern of the conductors onto the layer of photoresist, developing the photoresist and etching the layer of the conductive material, coating the resulting etched layer with a layer of dielectric material, applying a further layer of photoresist, the thickness of this layer being equal to the desired height of a relief pattern curing the further layer of photoresist, exposing, through a second mask, the desired structure of the relief pattern onto the layer of photoresist, developing the photoresist and allowing the layer to dry, resulting in spacers raised above the layer of dielectric material.

Preferably the substrate is flexible. This allows the production of the column plates to be made roll to roll.

ADVANTAGEOUS EFFECT OF THE INVENTION

The method of the present invention allows a column or address plate to be produced without the requirement of laser etching. This considerably reduces the cost and time of the production of column plates. Furthermore it avoids the creation of dust that is a result of laser ablation. If the process can be carried out in solution it may be carried out in relatively low cost processing equipment. The system is self-cleaning as most of the processes are wet and, if filtered liquids are used, will remove any dust that falls on parts of the display.

BRIEF DESCRIPTION OF THE DRAWINGS

The invention will now be described with reference to the accompanying drawings in which.

DETAILED DESCRIPTION OF THE INVENTION

Figure 1:
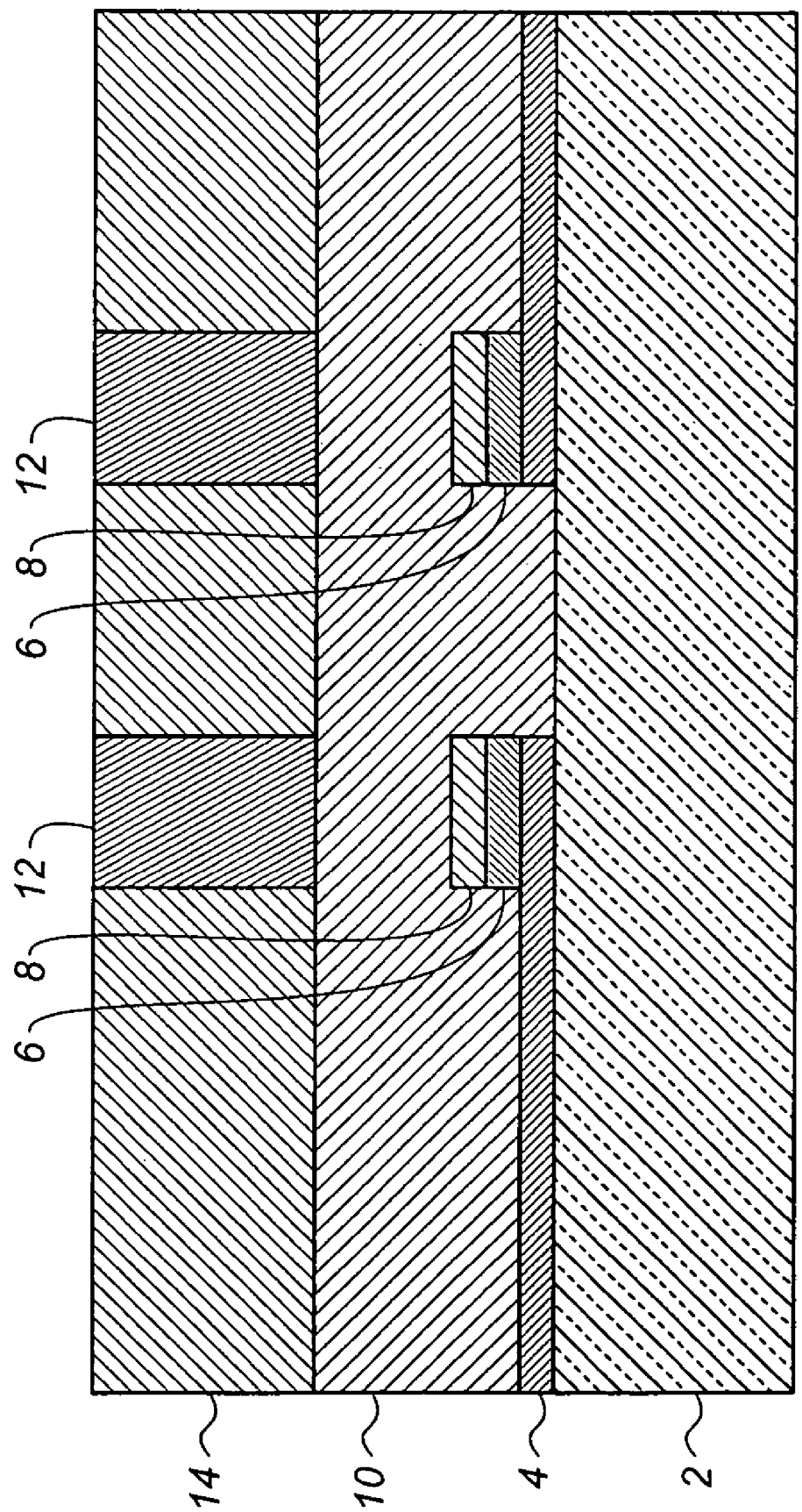
FIG. 1 is a schematic drawing, not to scale, illustrating the structure of the column plate formed by a preferred embodiment of the invention.

FIG. 1 schematically illustrates a cross section of the structure of a column plate manufactured in accordance with a preferred embodiment of the invention.

The structure illustrated in FIG. 1 comprises a substrate 2 over which has been coated a layer 4 of a conductive material. The substrate 2 is preferably transparent. If the structure is to be used as a deflecting foil device (as described in U.S. Pat. No. 6,525,483 and U.S. Pat. No. 4,113,360) it is essential that the substrate 2 is transparent. The conductive material forming the layer 4 is preferably inorganic. However, this is not an essential feature of the invention. A suitable material for the conductive layer 4 is indium tin oxide, ITO. It will be understood by those skilled in the art that this is an example only and that any suitable material may be used. In a preferred embodiment of the invention a layer of metal 6 is then coated over the layer 4 of conductive material. This is not an essential feature. However, such a layer of metal 6 reduces the electrical resistance of the layer 4 of conductive material. The metal may be silver but it will be understood by those skilled in the art that any suitable metal may be used. A layer of photoresist 8 is then coated on top of the layer of metal 6. If a layer of metal is coated onto the conductive material this photoresist must be a positive working photoresist. However, if no layer of metal is used and the photoresist is coated directly onto the conductive layer 4 the photoresist may be positive or negative. In the example described below RS resist is used, which is positively working.

The layer of photoresist 8 is cured and then exposed, through a mask, to the desired pattern of the transparent (and metal) conductors. The resist is subsequently developed. Where light has shone onto the photoresist it becomes soft and is removed. An etchant is then applied and removes the exposed layers of both the metal and the conductive material. Suitable etchants that would etch both the metal and the transparent conductor would be any oxidising acidic etch such as dilute chromic acid or acid permanganate. However, these are examples only and the person skilled in the art will understand that any suitable etchant can be used. The etching leaves a pattern of transparent conductors 16 on the substrate 2. The transparent conductors are topped with silver at this point.

The remains of the layer of photoresist are then exposed again, through a mask, to the desired relief pattern and the conducting mirror pattern underneath. The mask can be registered with the silver strips of the conductors to ensure accurate positioning. More of the photoresist layer becomes soft and is removed. It is possible that a further layer of photoresist could be applied after removal of the first resist with a suitable solvent but it is more efficient if the remains of first layer of resist are left on and re-used. A further etchant is then applied and removes the exposed part of the metal layer 6. This results in the removal of the layer of metal from the top of most of the transparent conductors to allow light to travel through the conductive layer over these areas but leaving silver conductors to reduce the resistance of the final address plate. The pattern of conducting metal mirrors left has the same pattern as the reliefs, to be described below. A different etchant is generally used for this second exposure to ensure that the conductive layer 4 is not further etched as well as the metal layer 6. An example would be the use of a mixture of iron (III) EDTA and a metal complexing agent. However a fast acting etchant on the metal could be used for a short time such that the conductive layer is not significantly etched at this point. It is preferable that any remaining resist is removed at this stage by treating with a suitable solvent.

A layer 10 of dielectric material is then coated onto the structure. The layer of dielectric material 10 has a thickness of between 0.5 μm and 50 μm. An example of a suitable dielectric material is epoxy resin. However it will be understood that the invention is not limited to this dielectric material. The layer of dielectric material 10 is dried and cured.

A further layer of photoresist 14 is then coated on top of the layer 10 of dielectric material. This layer can be formed of either negative or positive working photoresist. This may be the same photoresist as used earlier but it is not essential that this is so. The thickness of this layer corresponds to the desired height of the relief pattern. This can be in the order of approximately 1 to 50 μm. The resist may be liquid (as described in the example below) or a so-called dry resist that is applied from a sheet using heated rollers.

The layer 14 of photoresist is cured and then exposed, through a mask, to the desired pattern of the relief pattern. If the resist is positive working the same mask is used as used in the second exposure described above. If the resist is negative working a negative of the mask is used. The mask should be in registration with the conducting mirror pattern. The resist is subsequently developed. Where light has shone onto the photoresist it becomes soft and is removed. A pattern of reliefs, or spacers, 12 are thus obtained.

The structure obtained by the steps outlined above can form the lower part of a device such as a deflecting foil display. In this instance the layer of foil would be placed above the spacers 12. However, it will be understood by those skilled in the art that such a structure can be used for any display device in which a conductor underneath a relief pattern is required. Such devices include, but are not limited to, an electrowetting or electrophoretic device.

A description of an enabling embodiment follows:

EXAMPLE

Coating

This was a 0.2 micron evaporated silver coated onto 300 ohms/sq ITO on 175 micron transparent PET support. All work was carried on pieces cut to 200×150 mm.

Equipment

Exposure

A RS Components Ltd Ul V Exposure Unit was used with a sheet of film cassette velvet behind the sample to reduce scatter and improve contact. The built in timer was used as required. For times less than 30 s, the clockwork timer was set for greater than 1 minute and the mains switch operated for the desired time. The lamp took approximately 1 second to come on. This was used as a correction factor for short times.

Coating

The coating was carried out on a spirally wound bar coater made by RK Coater Ltd having a coating width of an approximately 300 mm. This used a 300×150 mm sheet of smooth cleaned aluminium about 1 mm thick which was taped with masking tape to the soft Estar coating onto the neoprene mat on the coater such that the long axis was parallel to the coating direction. The samples were taped to this. The height of the coating roller was set by eye—an inspection lamp was placed behind the required roller and the micrometers adjusted until the roller just touched the sample across the width.

Oven

A standard 'hotbox' oven set at the desired temperature was used.

Two hours were allowed for temperature stabilisation.

Registration

The masks were registered visually on a 12"×12" light box fitted with a Wratten 2C on the top to remove UV light. A simple 'linen tester' was used to provide magnification.

Solutions

| Silver and ITO etch | |
|---|---|
| potassium dichromate | 1 g |
| sulphuric acid | 100 g |
| water to | 1 litre |

| Silver Etch | |
|---|---|
| 1.56 molar ammonium iron (III) EDTA solution | 90 ml |
| ammonium thiosulphate | 50 g |
| acetic acid, glacial | 5 ml |
| water to | 1 litre |

| Resist Developer | |
|---|---|
| sodium hydroxide | 10 g |
| water to | 1 litre |

This was used for both RS resist and Shipley™ Resist.

| Rinse | |
|---|---|
| Kodak Photoflo | 0.5 ml |
| water to | 1 litre |

Resists
Silver Bus Bar Resist
RS Components Ltd Aerosol Photoresist (positive working).

This was coated using the coater above. The aerosol was sprayed into a sample tube ~5-10 ml and allowed to stand to warm up and allow the propellant to boil off before coating. This took about 20 minutes. One coating was used for both ITO and then silver etching without a recoat using the positive resist.

Shipley™ Resist.
Shipley™ SP220-7 resist was used. Although designed to be spin coated it was RK coated as described above.

Dielectric
RS Components Ltd. epoxy potting compound was used as follows:

5 g resin was mixed with 5 g hardener in a small vial. To this was added 10 g ethanol using a spatula, stirring until a clear solution was obtained. This was allowed to stand for at least 5 minutes before use to allow air bubbles to disperse.

Making Silver Bus Bars
Silver Bus Bar Resist Coating
To the aluminium sheet on the coater (see above) was taped, at both ends, the silver on ITO coating such that the long axis was parallel to the coating direction. A 12 micron coating bar was attached and the micrometers set so that the bar just touched the coating. The bar was moved to the tape at one end of the coating. RS resist (about 0.5 ml) was applied to the coating on the edge of the roller (on the side of the coating direction) with a pipette. The bar was then driven at about 50 mm/s. The coating was allowed to dry in the dark and was then put in an oven at 50° C. for 60 minutes. The coating was allowed to cool in the dark after taking from the oven. The coating was handled in the dark or subdued tungsten light until exposure.

ITO Etching (Which also Removes the Silver above the ITO)

Figure 2:
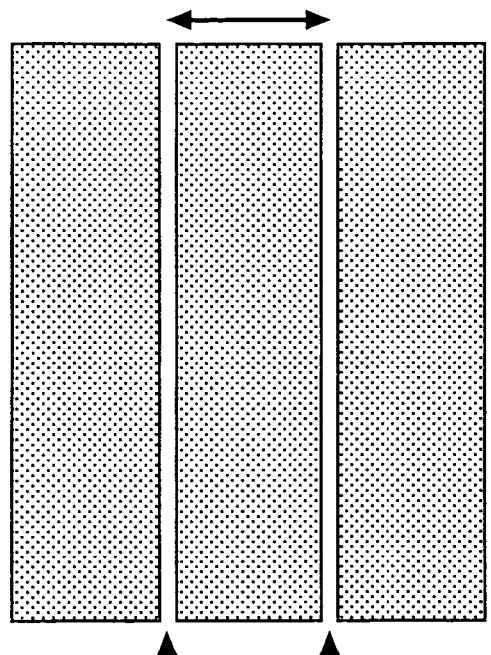
FIG. 2 illustrates a metal and transparent conductor etch mask.

The coating was exposed to the ITO etch mask, see FIG. 2, centring the coating first. This mask was made by laser exposing a computer drawn image, onto high contrast graphic arts material and then processing it in the usual way. The order of the pack when exposing the resist was exposing box/mask/coating (resist side to mask)/black velvet/lid. The lid was closed to ensure good contact. Exposure was for 90 seconds.

The coating was then removed and developed in the developer in a processing dish for 90 s at 21° C. The coating was washed in cold running water in another processing dish for 30 s. The coating was then processed in ITO etch for 240 s at 21° C. before washing again for 30 s. The coating was hung up to dry after dabbing with a paper towel.

Figure 3:
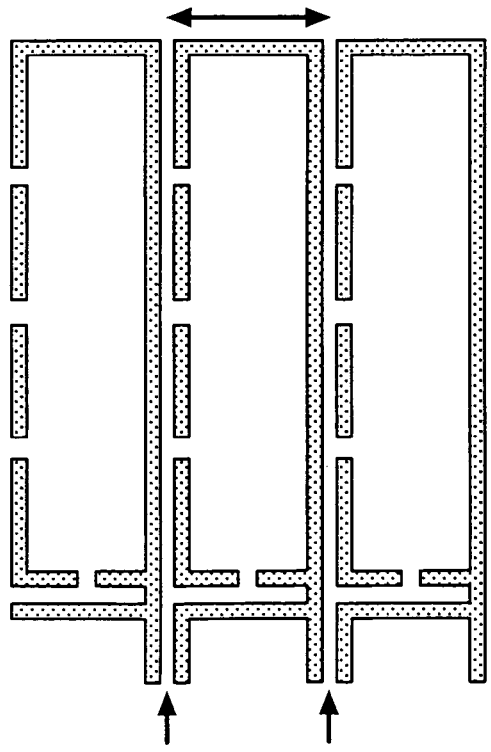
FIG. 3 illustrates a metal layer etch mask.

The resist was used again without recoating. The coating was exposed to a silver etch mask, see FIG. 3, registering this with the previous image using sticky tape to hold the registration. This mask was also made by laser exposing a computer drawn image, onto high contrast graphic arts material and then processing it in the usual way. The order of the pack when exposing the resist was exposing box/mask/coating (resist side to mask)/black velvet/lid. The lid of the exposing box was closed to ensure good contact. Exposure was for 50 s.

The coating was then removed and developed in the developer in a processing dish for 90 s at 21° C. The coating was washed in cold running water aiming a jet at the coatings to assist resist removal. The coating was then processed in silver etch for 40 s at 21° C. before washing again for 30 s.

The coating was washed in demineralised water and hung up to dry after dabbing with a paper towel.

Coating the Dielectric
The residue of any resin was removed by running acetone over the coating. This coating was taped to the aluminium sheet as for the resist coating, above. A 12 micron bar was selected. The dielectric solution was applied to the coating by the roller and again the bar driven at about 50 mm/s to give the dielectric coating. The dielectric was removed from areas around the central bus bar square using cotton wool soaked in ethanol. A 6 mm border was left around the square coated in dielectric.

This coating was allowed to stand for 45-75 minutes to allow the alcohol to evaporate before putting in a 90° C. oven for 60 minutes to cure. The coating was allowed to cool.

Making the Relief
This coating was taped to the aluminium sheet as for the resist coating, above. A 12 micron bar was selected, put in the coater and adjusted as for the resist above. The Shipley™ resist was applied to the coating by the roller and again the bar pulled down as before to give the second thick resist coating on top of the dielectric. This coating was carried out in subdued tungsten light and the coatings were kept in the dark or under subdued tungsten light.

The coatings were allowed to stand for at least 5 minutes in a well-ventilated dark room to allow most of the solvent to evaporate before putting in the oven for 60 minutes at 90° C. The coating was allowed to cool in a dark box. The coating was then registered with mask silver etch mask, FIG. 3 again, lining up the silver tracks/bus bars with the mask. The pack was exposed on the UV exposing box for 120 s. The coating was then developed in resist developer for 30 s at 20° C. and then washed in cold water for 30 s and then 5 s at 20° C. in rinse. The coating was allowed to dry. Excess resist around the central square of image was removed carefully with cotton wool soaked in acetone, again leaving a 5 mm border.

The invention has been described in detail with reference to preferred embodiments thereof. It will be understood by those skilled in the art that variations and modifications can be effected within the scope of the invention.

PARTS LIST 2 substrate
4 layer
6 layer of metal
8 layer of photoresist
10 layer of dielectric material
12 spacers
14 layer of photoresist
16 transparent conductors

The invention claimed is:
1. A method of producing an address plate comprising the steps of:
coating a layer of conductive material onto a substrate;
coating a layer of metal over the conductive material;
coating a layer of photoresist above this layer of metal;
curing the layer of photoresist;

exposing, through a first mask, the desired pattern of the conductors onto the layer of photoresist;

developing the photoresist and etching the layer of metal and the layer of conductive material;

exposing, through a second mask, a desired relief pattern onto the layer of the photoresist;

developing the photoresist and etching only the layer of metal;

coating the resulting etched layer with a layer of dielectric material;

applying a further layer of photoresist, the thickness of this layer being equal to the desired height of a relief pattern;

curing the further layer of photoresist;

exposing, through a third mask, the desired structure of the relief pattern onto the further layer of photoresist; and developing the photoresist and allowing the layer to dry, resulting in spacers raised above the layer of dielectric material.

2. A method as claimed in claim 1, wherein a layer of metal is coated onto the layer of conductive material prior to the layer of photoresist being applied, the layer of photoresist being a layer of positive working photoresist, the etching of the metal layer taking place simultaneously with the etching of the conductive material, and further exposing, through a mask, a desired pattern of metal conductors onto the layer of positive working photoresist, developing the photoresist and further etching the metal layer.

3. A method as claimed in claim 2, wherein the metal is silver.

4. A method as claimed in claim 1, wherein the substrate is flexible.

5. A method as claimed in claim 1, wherein the substrate is transparent.

6. A method as claimed in claim 1, wherein the conducting layer is comprised of an inorganic material.

* * * * *